United States Patent [19]

Minamisawa et al.

[11] Patent Number: 4,861,515

[45] Date of Patent: Aug. 29, 1989

[54] POLYESTER COMPOSITION

[76] Inventors: Tsuyoshi Minamisawa, Mishima; Katsunori Endo; Toshio Kanoe, both of Fuji, all of Japan

[21] Appl. No.: 129,779

[22] Filed: Dec. 7, 1987

[30] Foreign Application Priority Data

Dec. 26, 1986 [JP] Japan ................... 61-309869

[51] Int. Cl.$^4$ ................... C09K 19/52; C09K 9/06
[52] U.S. Cl. ................... 252/299.01; 523/213; 528/176; 528/183
[58] Field of Search ................... 252/299.01; 106/417, 106/490, 475, 287.16, 287.14; 528/176, 183; 523/213

[56] References Cited

U.S. PATENT DOCUMENTS 4,233,366 11/1980 Sample et al. ................... 106/417
4,499,256 2/1985 Blundell et al. ................... 528/183
4,540,737 9/1985 Wissbrun et al. ................... 524/599

Primary Examiner—Theodore Morris

[57] ABSTRACT

A polyester composition which comprises a polyester being processable in the melt state and being capable of forming the anisotropic phase in the melt state and an inorganic filler having been surface treated with an epoxysilane compound.

9 Claims, No Drawings

POLYESTER COMPOSITION

BACKGROUND OF THE INVENTION

FIELD OF THE INVENTION

The present invention relates to an aromatic polyester liquid crystal polymer composition containing an inorganic filler having been surface treated with an epoxysilane compound incorporated therein which can provide molded articles having excellent dimensional accuracy and mechanical strength.

DISCUSSION OF RELATED ART

A liquid crystal polymer, particularly a liquid crystal polymer of which the main skeleton is comprised of an aromatic polyester, has attracted attention as a relatively new material not only as having excellent mechanical properties, thermal stability, chemical resistance, and moldability but also as having excellent function such as a small molding shrinkage factor and a small coefficient of linear expansion. By taking advantage of these features, the development of the application of the liquid crystal polymer for audio parts, automobile parts, and electrical components have progressed.

A melt-processable polyester capable of forming an anisotropic melt phase (hereinafter abbreviated as "liquid crystal polyester") can alone be processed into the above-mentioned products. Further, it is frequently used in the form of a composite material containing various reinforcing materials or fillers incorporated therein in order to improve the physical properties thereof. However, it is yet unsatisfactory with respect to mechanical properties and, therefore, there is left room for improvement.

SUMMARY OF THE INVENTION

In view of the above-mentioned circumstances, the present inventors have made extensive and intensive studies on a surface treating agent which can impart excellent mechanical strength without sacrificing other physical properties to an inorganic-filled liquid crystal polyester composition, which led to the completion of the present invention.

A polyester composition of the present invention comprises a polyester being processable in the melt state and being capable of forming the anisotropic phase in the melt state and an inorganic filler having been treated with an epoxysilane compound. It is preferred that the composition comprises 30 to 99.5 percent by weight of said polyester and 0.5 to 70 percent by weight of said inorganic filler. The inorganic filler may be in the form of particles, flakes or fibers. The most preferable inorganic filler includes potassium titanate, glass flakes, talc and mica.

The liquid crystal polyester which may be used in the present invention is a melt processable polyester and has properties such that the molecular chains are regularly arranged parallel to each other in a molten state. The state in which molecules are arranged in this way is often called a liquid crystal state or a nematic phase of a liquid crystal material. Such polymer molecules are generally comprised of polymers which are slender and flat and have considerably high rigidity along the major axis of the molecules and a plurality of chain-extending bonds which are usually in either a coaxial relationship or a parallel relationship with each other. The liquid crystal polyester of the invention has the anisotropic phase after it has been heated and molded.

The properties of the anisotropic molten phase may be examined by a customary polarimetric method using crossed polarizers. More particularly, the anisotropic molten phase can be examined by observing a molten sample placed on a Leitz hot stage in a nitrogen atmosphere at a magnification of 40 under a Leitz polarization microscope. The above-mentioned polymer is optically anisotropic. Namely, when it is placed between crossed polarizers, it permits transmission of a light beam. If the sample is optically anisotropic, the polarized light will be transmitted, even when it is in a static state.

The components of the polymer which forms the anisotropic molten phase as mentioned above are those selected from the group consisting of:

①  at least one member selected from the group consisting of aromatic dicarboxylic acids and alicyclic dicarboxylic acids;

②  at least one member selected from the group consisting of aromatic diols, alicyclic diols, and aliphatic diols;

③  at least one member selected from the group consisting of aromatic hydroxy carboxylic acids;

④  at least one member selected from the group consisting of aromatic thiol carboxylic acids;

⑤  at least one member selected from the group consisting of aromatic dithiols and aromatic thiol phenols; and ⑥  at least one member selected from the group consisting of aromatic hydroxy amines and aromatic diamines. The polymer which forms the anisotropic molten phase is a polyester capable of forming an anisotropic molten phase and comprised of a combination of components such as:

(I) a polyester comprised of the components ① and ②;

(II) a polyester comprised of only the components ③;

(III) a polyester comprised of the components ①, ②, and ③;

(IV) a polythiolester comprised of only the component ④;

(V) a polythiolester comprised of the components ① and ⑤;

(VI) a polythiolester comprised of the components ①, ④, and ⑤;

(VII) a polyesteramide comprised of the components ①, ③, and ⑥; and (VIII) a polyesteramide comprised of the components ①, ②, ③, and ⑥.

Aromatic polyazomethines are also a polymer which forms the anisotropic molten phase, although they are not included in the category of the abovementioned combinations of components. Particular examples of such aromatic polyazomethines include poly(nitrilo-2-methyl-1,4-phenylenenitriloethylidyne-1,4-phenylenethylidyne); poly(nitrilo-2-methyl-1,4-phenylenenitrilomethylidyne-1,4-phenylenemethylidyne; and poly(-nitrilo-2-chloro-1,4-phenylenenitrilomethylidyne-1,4-phenylenemethylidyne).

Further, polyester carbonates are also a polymer which forms the anisotropic molten phase, although they are not included in the category of the abovementioned combinations of components. They are comprised essentially of 4-oxybenzoyl units, dioxyphenyl units, dioxycarbonyl units, and terephthaloyl units.

The above-mentioned polyesters (I), (II), and (III) and polyester-amide (VIII) which are polymers capable of forming an anisotropic molten phase suitable for use in the present invention may be produced by various ester forming processes in which organic monomer compounds having functional groups capable of forming required repetitive units through condensation are mutually reacted. Examples of the functional groups of these organic monomer compounds include carboxyl group, hydroxyl group, ester group, acyloxy group, acyl halide group, and amino group. The organic monomer compounds can be reacted by a melt acidolysis method in the absence of any heat exchange fluid. According to this method, the monomers are first heated together to form a melt of reactants. As the reaction proceeds, solid polymer particles are suspended in the melt. Vacuum may be applied in order to facilitate the removal of volatile matter (e.g., acetic acid or water) which is produced as a by-product in the final stage of the condensation.

Further, a slurry condensation method may also be adopted in forming a liquid crystal aromatic polyester suitable for use in the present invention. In this method, the solid product is obtained in such a state that it is suspended in a heat exchange medium.

In both the above-mentioned melt acidolysis process and slurry polymerization process, the organic monomer reactants from which the liquid crystal polyester is derived may be used in the reaction in a modified form in which the hydroxyl groups of such monomers have been esterified (i.e., in the form of a lower acyl ester). The lower acyl group preferably has 2 to 4 carbon atoms. It is preferred that acetates of the organic monomer reactants be used in the reaction.

Representative examples of the catalyst which can be used at will in both the melt acidolysis and slurry process include dialkyltin oxides (e.g., dibutyltin oxide), diaryltin oxides, titanium dioxide, antimony trioxide, alkoxytitanium silicate, titanium alkoxide, alkali and alkaline earth metal salts of carboxylic acids (e.g., zinc acetate), Lewis acids (e.g., $BF_3$) and gaseous catalysts such as hydrogen halides (e.g., HCl). The amount of the catalyst is generally about 0.001 to 1% by weight, preferably about 0.01 to 0.2% by weight, based on the total weight of the monomers.

The liquid crystal polymers suitable for use in the present invention tend to be substantially insoluble in usual solvents, which renders them unsuitable for use in solution processing. However, as mentioned above, these polymers may be readily processed by ordinary melt processing. Especially preferable liquid crystal polymers are those soluble in pentafluorophenol to some extent.

The liquid crystal polyester suitable for use in the present invention have a weight-average molecular weight of about 2,000 to 200,000, preferably about 10,000 to 50,000, and particularly preferably about 20,000 to 25,000. On the other hand, the wholly aromatic polyester-amide suitable for the present invention has a molecular weight of about 5,000 to 50,000, preferably about 10,000 to 30,000, e.g., 15,000 to 17,000. The molecular weight may be determined by gel permeation chromatography and other standard determination methods which do not involve the formation of a solution of polymers, e.g., by determining the terminal groups by infrared spectroscopy in the form of a compression-molded film. Alternatively, the molecular weight may be determined by a light scattering method in the form of a pentafluorophenol solution.

The above-mentioned liquid crystal polyesters and polyester-amides exhibit an inherent viscosity (I.V.) of at least about 2.0 dl/g, e.g., about 2.0 to 10.0 dl/g, as determined at 60° C. in the form of a solution prepared by dissolving the polymer in pentafluorophenol to have a polymer concentration of 0.1% by weight.

Polyesters which form an anisotropic melt phase suitable for use in the present invention are aromatic polyesters and aromatic polyester-amides and may also include polyesters which partially contain aromatic polyester units and aromatic polyester-amide units in the same molecular chain.

Examples of the compounds constituting the above-mentioned polymers include naphthalene compounds such as 2,6-naphthalenedicarboxylic acid, 2,6-dihydroxynaphthalene, 1,4-dihydroxynaphthalene, and 6-hydroxy-2-naphthoic acid, biphenyl compounds such as 4,4'-biphenyldicarboxylic acid and 4,4'-dihydroxybiphenyl, compounds represented by the following general formulae (I), (II), or (III):

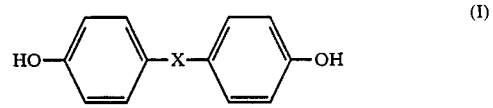

(I)

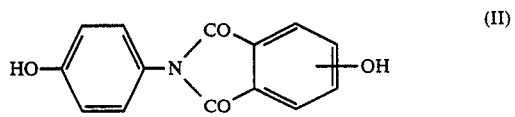

(II)

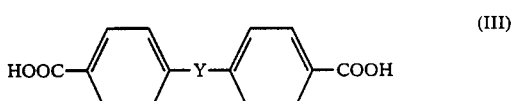

(III)

[wherein X is a group selected from among and alkylene (having 1 to 4 carbon atoms), an alkylidene, —O—, —SO—, —$SO_2$—, —S—, and —CO—; and Y is a group selected from —$(CH_2)_n$— (wherein n is 1 to 4) and —$O(CH_2)_nO$— (wherein n is 1 to 4)]; parasubstituted benzene compounds such as p-hydroxybenzoic acid, terephthalic acid, hydroquinone, p-aminophenol, and p-phenylenediamine and nucleus-substituted compounds thereof (wherein the substituent is selected from among chlorine, bromine, methyl, phenyl, and 1-phenylethyl); and meta-substituted benzene compounds such as isophthalic acid and resorcinol.

Further, the liquid crystal polyester which is used in the present invention may be a polyester partially containing a polyalkylene terephthalate portion which does not exhibit any anisotropic melt phase in the same molecular chain besides the above-mentioned components. In this case, the alkyl group has 2 to 4 carbon atoms.

Among the polymers comprised of the above-mentioned components, polymers containing at least one member selected from among naphthalene compounds, biphenyl compounds, and para-substituted benzene compounds as essential component are more preferable. Particularly preferable para-substituted benzene compounds include p-hydrobenzoic acid, methylhydroquinone, and 1-phenylethylhydroquinone.

Polyesters capable of forming an anisotropic melt phase which are particularly preferably used in the present invention are those containing about 10 mol% or more of repetitive units containing a naphthalene portion, such as 6-hydroxy-2-naphthoyl, 2,6-dihydroxynaphthalene, and 2,6-dicarboxynaphthalene. Preferable polyester-amides are those containing repetitive units containing the above-mentioned naphthalene portion and a portion comprised of 4-aminophenol or 1,4-phenylenediamine.

Specific examples of the compounds which are components in the above-mentioned polymers (I) to (VIII) and specific examples of polyester capable forming an anisotropic melt phase and suitable for use in the present invention are described in Japanese Patent Laid-Open No. 69866/1986.

Examples of the inorganic filler useful for the present invention include general inorganic fibers such as glass fiber, carbon fiber, metallic fiber, ceramic fiber, boron fiber, potassium titanate fiber, and asbestos; and powdery or sheet inorganic fillers such as calcium carbonate, silicate, alumina, silica aluminum hydroxide, talc, clay, mica, glass flake, powdery glass, glass beads, quartz powder, silica sand, wollastonite, various powdery metals, carbon black, sulfates such as barium sulfate, powdery materials such as plaster of Paris, silicon carbide, chinese white, boron nitrite, and silicon nitride; and whisker and metallic whisker.

The above-mentioned inorganic fillers may be used alone or in a combination of two or more of them.

In general, a binder is used when an inorganic filler is in the form of filament yarn. Since the amount of the binder is larger than that of the surface treating agent, the physical properties are frequently varied depending upon the kinds of the binders. Therefore, the surface treating agent used in the present invention is suitable for use with inorganic fillers which do not require the use of the binder. Examples of such an inorganic filler include particulate inorganic fillers such as potassium titanate fiber, alumina, silica, talc, mica, glass flake, and glass bead. The potassium titanate fiber is particularly preferable.

The potassium titanate fiber useful for the present invention is a fine white acicular single crystal fiber having an average fiber length of 5 to 120 μm, preferably 10 to 20 μm and an average fiber diameter of 0.1 to 1.0 μm, preferably 0.2 to 0.5 μm.

In the present invention, the epoxysilane compound which is used as the surface treating agent of the above-mentioned inorganic filler is represented by the following general formula:

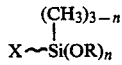

(wherein n is an integer of 2 or 3, R is —CH$_3$ or —C$_2$H$_5$, and X is an epoxy group).

Examples of the epoxysilane compound include γ-glycidoxypropyltrimethoxysilane and β-(3,4-epoxycyclohexyl)ethyltrimethoxysilane.

The surface of the filler can be treated, e.g., by a method which comprises preparing a dilute aqueous solution of an epoxysilane compound, immersing a filler in the dilute aqueous solution, and separating and drying the filler.

In the present invention, the amount of the inorganic filler incorporated is 0.5 to 70% by weight based on the total weight of the composition. When the amount of the filler is less than 0.5% by weight, the improvement in the dimensional accuracy and mechanical strength which is the primary object of the present invention cannot be attained. On the other hand, when the amount of the filler exceeds 70% by weight, there arise problems with extrusion, moldability, etc. A particularly preferable amount of the filler incorporated is 5 to 50% by weight from the standpoint of mechanical strength.

Further, the liquid crystal polyester of the present invention may be in the form of a polymer blend with other thermoplastic resins in such an amount as will not spoil the purpose of the present invention.

The thermoplastic resins used in this case are not particularly limited. Examples of the thermoplastic resins include polyolefins such as polyethylene and polypropylene, aromatic polyesters comprised of an aromatic dicarboxylic acid and a diol or a hydroxycarboxylic acid, such as polyethylene terephthalate and polybutylene terephthalate, polyacetal (homopolymer or copolymer), polystyrene, polyvinyl chloride, polyamide, polycarbonate, ABS, polyoxyphenylene oxide, polyoxyphenylene sulfide, and fluorocarbon resin. These thermoplastic resins may be used in the form or a mixture of two or more of them. Further, if necessary, various additives may be added to these resins in order to improve various properties such as mechanical, electrical, and chemical properties and flame retardancy.

For example, known materials which are added to general thermoplastic resins and thermosetting resins, i.e., plasticizers, stabilizers such as antioxidants and ultraviolet absorbers, antistatic agents, surfactants, flame retardants, coloring materials such as dyes and pigments, lubricants for improving the flowability and releasability, and crystallization promoters (nucleating agents) can be used at will according to the requirements for properties.

EFFECT OF THE INVENTION

The liquid crystal polyester resin composition of the present invention containing an epoxysilane-treated inorganic filler incorporated therein exhibits excellent dimensional accuracy and mechanical properties. The present invention comprising the above-mentioned constitutions exhibits effects which cannot be attained by general surface treating agents. For example, when an aminosilane-treated filler is used, the mechanical strength is lowered. On the other hand, when an epoxysilane-treated filler is used, the mechanical strength is improved. Particularly, a remarkably excellent effect can be attained when the inorganic filler is a potassium titanate fiber.

DETAILED DESCRIPTION OF THE INVENTION

The invention is additionally illustrated in connection with the following Examples and Comparative Examples which are to be considered as illustrative of the present invention. It should be understood, however, that the invention is not limited to the specific details of the Examples.

Examples 1 to 4 and Comparative Example 1 to 9

Aromatic liquid crystal polyester polymer A (which will be mentioned later) was mixed with a predetermined amount of an inorganic filler the surface of which has been treated with a surface treating agent as shown in Table 1. The mixture was kneaded in a molten state with an extruder and then extruded to obtain pellets. The pellets were dried with a hot air drier kept at 140° C. so as to have a water content of 100 ppm. The pellets were molded into various test specimens by injection molding. The physical properties of the test specimens were determined according to the followng ASTM testing methods.

The results are shown in Table 1.
tensile strength: ASTM D 638,
bending strength: ASTM D 790.

Further, the molding shrinkage factor was determined by molding a square specimen having a size of 120×120×3 mm from a film gate provided at its one side. The conditions for injection molding were as follows: a cylinder temperature of 270° to 290° C.; a mold temperature of 120° to 130° C.; an injection pressure of 600 kg/cm²; and a rate of injection of 0.6 m/min.

As can be seen in Table 1, the improvements in the mechanical properties and molding shrinkage factor were attained.

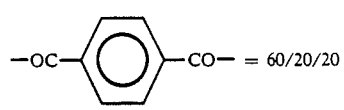

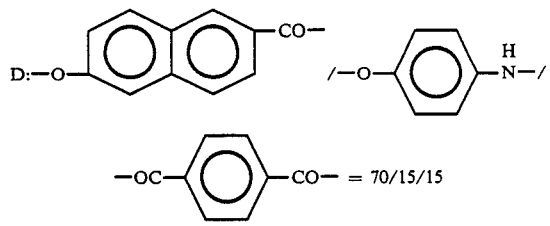

TABLE 1

| | filler | amt. of addn. (wt %) | surface-treating agent | tensile strength (kgf/cm²) | bending strength (kg/cm²) | molding shrinkage factor (%) |
|---|---|---|---|---|---|---|
| Ex. | | | | | | |
| 1 | potassium titanate whisker | 30 | epoxysilane | 1530 | 2210 | 0.24 |
| 2 | glass flake | 30 | epoxysilane | 1540 | 1660 | 0.41 |
| 3 | talc | 30 | epoxysilane | 1650 | 1700 | 0.37 |
| 4 | mica | 30 | epoxysilane | 1400 | 1460 | 0.32 |
| Comp. Ex. | | | | | | |
| 1 | potassium titanate whisker | 30 | aminosilane | 990 | 1270 | 0.25 |
| 2 | potassium titanate whisker | 30 | non-treated | 1090 | 1730 | 0.25 |
| 3 | glass flake | 30 | aminosilane | 1100 | 1250 | 0.41 |
| 4 | glass flake | 30 | non-treated | 1350 | 1450 | 0.41 |
| 5 | talc | 30 | aminosilane | 1350 | 1200 | 0.36 |
| 6 | talc | 30 | non-treated | 1540 | 1450 | 0.37 |
| 7 | mica | 30 | aminosilane | 1220 | 1100 | 0.32 |
| 8 | mica | 30 | non-treatment | 1300 | 1290 | 0.31 |
| 9 | none | — | — | 2000 | 1550 | 1.05 |

The same tests as in Example 1 were conducted on resins B, C, D, and E (all of which will be mentioned later). The results obtained were the same as those of Example 1.

The resins A to E used in the above examples were respectively comprised of the following structural units:

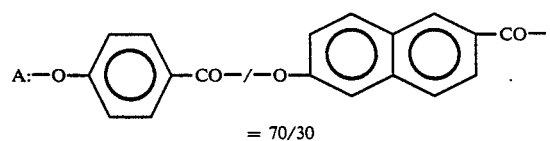

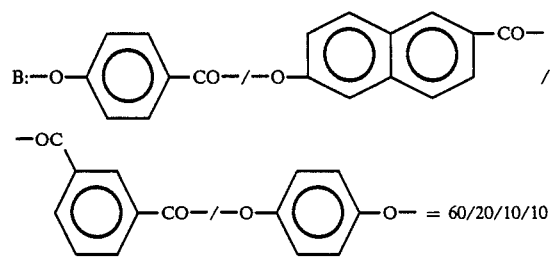

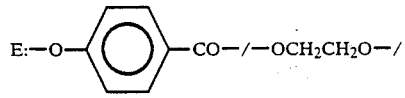

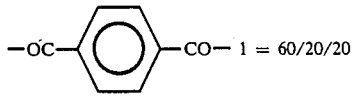

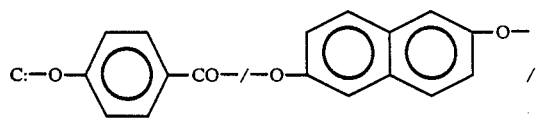

(The above numerals represent molar ratios.)

What is claimed is:

1. A polyester composition which comprises 30 to 99.5 percent by weight of a polyester being processable in the melt state and being capable of forming the anisotropic phase in the melt state and 0.5 to 70 percent by weight of an inorganic filler having been surface treated with an epoxysilane compound.

2. The polyester composition as claimed in claim 1, in which said inorganic filler is in the form of particles, flakes or fibers.

3. The polyester composition as claimed in claim 1, in which said inorganic filler is potassium titanate, glass flakes, talc or mica.

4. The polyester composition as claimed in claim 1, in which said inorganic filler is glass fiber, carbon fiber, metallic fiber, ceramic fiber, boron fiber, potassium titanate fiber, asbestos, calcium carbonate, silicate, alumina, silica, aluminum hydroxide, talc, clay, mica, glass flake, powdery glass, glass beads, quartz powder, silica sand, wollastonite, powdery metal, carbon black, barium sulfate, plaster of Paris, silicon carbide, Chinese white, boron nitrite, silicon nitride or whisker.

5. The polyester composition as claimed in claim 1, in which said epoxysilane compound is represented by the formula:

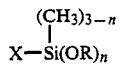

wherein n is an integer of 2 or 3, R is —CH$_3$ or —C$_2$H$_5$ and X is an epoxy group.

6. The polyester composition as claimed in claim 1, in which said epoxysilane is γ-glycidoxypropyltrimethoxysilane.

7. The polyester composition as claimed in claim 1, in which said epoxysilane is β-(3,4-epoxycyclohexyl)ethyltrimethoxysilane.

8. The polyester composition as claimed in claim 1, wherein the surface treatment of the inorganic filler comprises preparing a dilute aqueous solution of an epoxysilane compound, immersing a filler in said solution and separating and drying the filler, forming the inorganic filler having been surface treated with an epoxysilane compound.

9. The polyester composition as claimed in claim 1, wherein the percent weight of the inorganic filler is 5 to 50 percent.

* * * * *